United States Patent
Seshadri

(10) Patent No.: US 10,243,590 B1
(45) Date of Patent: Mar. 26, 2019

(54) DETECTION OF ERRORS IN A TERNARY CONTENT ADDRESSABLE MEMORY

(71) Applicant: Amazon Technologies, Inc., Seattle, WA (US)

(72) Inventor: Kiran Kalkunte Seshadri, Cedar Park, TX (US)

(73) Assignee: Amazon Technologies, Inc., Seattle, WA (US)

( * ) Notice: Subject to any disclaimer, the term of this patent is extended or adjusted under 35 U.S.C. 154(b) by 300 days.

(21) Appl. No.: 14/857,787

(22) Filed: Sep. 17, 2015

(51) Int. Cl.
  *H03M 13/29* (2006.01)
  *G11C 15/00* (2006.01)
  *G06F 11/10* (2006.01)

(52) U.S. Cl.
  CPC ..... *H03M 13/2906* (2013.01); *G06F 11/1076* (2013.01); *G11C 15/00* (2013.01)

(58) Field of Classification Search
  CPC . H03M 13/2906; G06F 11/1076; G11C 15/00
  See application file for complete search history.

(56) References Cited

U.S. PATENT DOCUMENTS

| | | | |
|---|---|---|---|
| 7,290,083 B2 | 10/2007 | Shoham et al. | |
| 7,345,897 B2 | 3/2008 | Krishnan et al. | |
| 7,594,158 B2 | 9/2009 | Wickeraad | |
| 7,689,889 B2 | 3/2010 | Cohen | |
| 7,757,152 B2 | 7/2010 | Wickeraad et al. | |
| 8,887,026 B2 | 11/2014 | Bremler-Barr et al. | |
| 2005/0289295 A1* | 12/2005 | Shoham | G11C 15/00 711/108 |
| 2012/0110411 A1 | 5/2012 | Cheung et al. | |
| 2015/0095738 A1 | 4/2015 | Zampaglione et al. | |
| 2015/0106677 A1 | 4/2015 | Greenfield et al. | |

OTHER PUBLICATIONS

Sideris et al., IEEE Transactions on Computers, vol. 61, No. 12, Dec. 2012, pp. 1778-1788.*
Sideris et al., IEEE Transactions on Computers, vol. 61, No. 12, Dec. 2012, pp. 1778-1788 (Year: 2012).*
"Cost Effective Protection Techniques for TCAM Memory Arrays," I. Sideris, K. Pekmestzi, in IEEE Transactions on Computers vol. 61, No. 12, Dec. 2012, pp. 1778-1788.
U.S. Appl. No. 14/873,867, filed Oct. 2, 2015, Kiran Kalkunte Seshadri, et al.

* cited by examiner

*Primary Examiner* — April Y Blair
*Assistant Examiner* — Rong Tang
(74) *Attorney, Agent, or Firm* — Robert C. Kowert; Meyertons, Hood, Kivlin, Kowert & Goetzel, P.C.

(57) ABSTRACT

A ternary content addressable memory (TCAM) may implement complete detection of single and double bit errors for entries. A single error correction double error detection (SECDED) error correction code may be generated and maintained for each entry in the TCAM. The SECDED error correction code may be generated from the parity bit and bits that indicate don't-care conditions in memory cells storing a value for an entry in the TCAM. When an entry of the TCAM is accessed, the value of the entry may be validated with respect to the SECDED error correction code. All single bit errors and double bit errors in the value or data stored for the value, such as a parity bit or value bit, may be detected. All single bit errors and some double bit errors may be corrected.

18 Claims, 7 Drawing Sheets

DETECTION OF ERRORS IN A TERNARY CONTENT ADDRESSABLE MEMORY

BACKGROUND

Error detection and correction techniques ensure that data stored in memory devices is reliable for performing operations based on the stored data. Error detection may be performed when a location in a memory device is accessed (e.g., read from) in order to ensure that errors may be caught prior to performing an action based on the data in the location. Error detection techniques are not without cost. Some forms of error detection techniques may increase the latency or time spent accessing the memory device. Error detection techniques may also consume portions of chip area or power that would be otherwise used to implement other tasks.

Figures 1A, 1B:
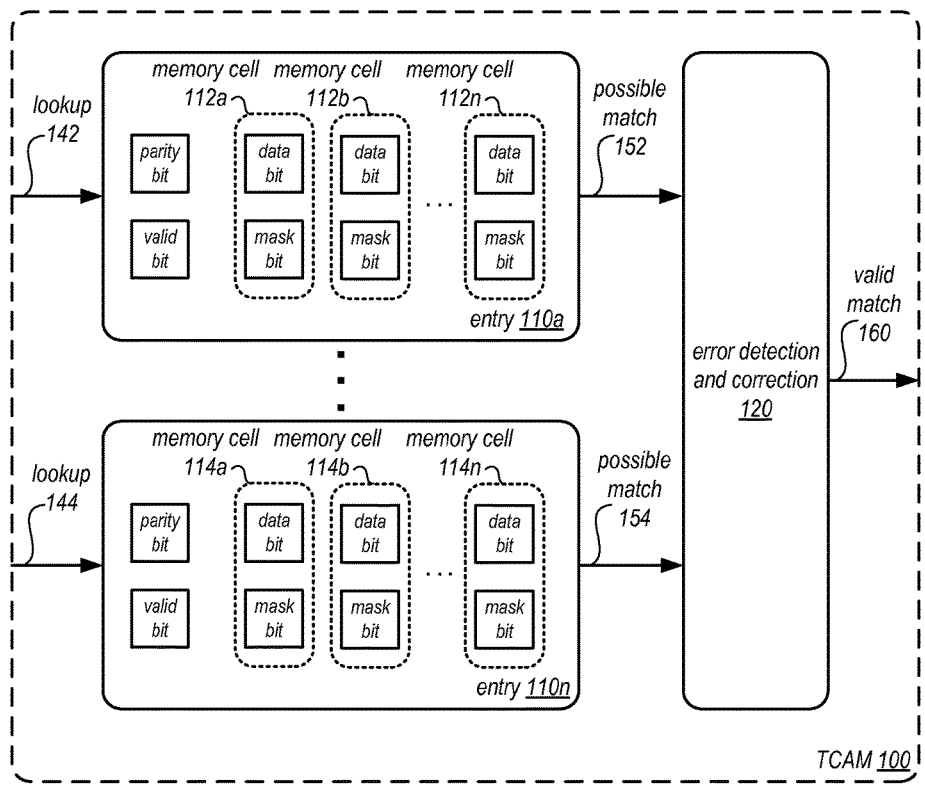
FIG. 1A illustrates a logical block diagram of performing error detection and correction in a ternary content addressable memory (TCAM), according to some embodiments.
FIG. 1B illustrates an encoding table for memory cells of a TCAM, according to some embodiments.

While embodiments are described herein by way of example for several embodiments and illustrative drawings, those skilled in the art will recognize that the embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. As used throughout this application, the word "may" is used in a permissive sense (i.e., meaning having the potential to), rather than the mandatory sense (i.e., meaning must). Similarly, the words "include", "including", and "includes" mean including, but not limited to.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, paragraph (f), for that unit/circuit/component. Additionally, "configured to" can include generic structure (e.g., generic circuitry) that is manipulated by software or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On" or "Dependent On." As used herein, these terms are used to describe one or more factors that affect a determination. These terms do not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

The systems and methods described herein may implement complete single and double error detection for entries of a ternary content addressable memory. Ternary content addressable memory (referred to hereinafter as "TCAM") is a form of associative storage that compares input data with values of entries in the storage to identify a matching entry. Matching entries may then be used to return data corresponding to the matching entry, a lookup return value. Individual bit values of input data, such as a data word (or other lookup key), may be compared to the bits of the entries when identifying a match. TCAMs introduce a don't-care state for a bit value, in addition to the 1 or 0 possible bit values, as illustrated in FIG. 1B. In this way, a single entry in a TCAM can be a match for multiple lookup keys.

In order to implement the additional don't-care state, additional bit values may be stored for an entry of a TCAM.

For example, as illustrated in FIG. 1A, an entry, such as entry 110a, of TCAM 100 may store a data bit and mask bit for each memory cell 112 in the entry. A memory cell, such as memory cells 112a, 122b through 112n, may store the value of individual bits of the value of entry 110a, which is used to match lookup keys. FIG. 1B illustrates an encoding table for memory cells of a TCAM, according to some embodiments. Generally, bits may have a value of 1 or 0. Thus, a mask bit and a data bit may have a value of 1 or 0. In memory cell encoding table 170, the values of the mask bit and data bit together indicate the state or logic indicated by a memory cell. For instance, if the mask bit is 0 and the data bit is 1, then the data value is 1. Conversely, if the mask bit is 1 and the data bit is 0, then the data value is 0. If both the mask bit and the data bit are 0, then a don't-care condition for the memory cell may be indicated. Thus, when determining whether a particular bit of a lookup key matches the corresponding bit of the entry value indicated by the memory cell in the entry, a don't-care state indicates that either value of the particular bit of the lookup key, 1 or 0, is considered a match for the corresponding bit of the entry value. An illegal state, illustrated as mask and data bit values of 1 in FIG. 1B, may indicate that an error exists in the memory cell.

An entry 110 for TCAM 100, may also implement a parity bit. A parity bit may be determined from the data bit values of each memory cell 112 in an entry 110. For example, the parity bit may be determined based on the number of times a value, 1 or 0, is stored in the data bits. Consider a parity bit that is determined from the number of times 1 is stored in data bits for memory cells 112a-112n. If the number of 1s is even, then the parity bit may be set to a 1 value. However, if the number of 1s is odd, then the parity bit may be set to a 0 value. In at least some embodiments, an entry 110 for TCAM 100 may include a valid bit. The valid bit may be set, storing a value of 1, to indicate that the entry is valid for performing lookups. If, however, the valid bit is not set, storing a value of 0, then the valid bit indicates that the entry should not be considered for matching with a lookup key.

TCAM 100 may store a large number of entries 110, such as entries 110a through 110, each storing a respective value in bits at individual memory cells (e.g., memory cells, 112a, 122b, 112n, 114a, 114b, and 114n), and a parity bit and valid bit. The correspondingly large numbers of bits stored for entries 110 are susceptible to error conditions. Bit errors or bit flips may occur, changing the original value of a bit to the other value, from a value of 0 to 1, or from a value of 1 to 0. Such errors (sometimes referred to as soft errors) may occur when radioactive decay (e.g., alpha particles or neutrons from materials implementing the hardware of the TCAM (e.g., an integrated circuit implementing a TCAM)) changes the electrical charge of bits stored in the TCAM. As TCAMs increase in size, the density of stored bits may result in a greater susceptibility to bit errors.

Error detection and correction techniques may be implemented to detect and possibly correct bit errors in the bits stored for an entry of a TCAM. In TCAM 100, error detection and correction 120 may be implemented to provide complete detection of all single and double bit errors in the bits stored for an entry. Thus, error detection and correction 120 may detect a single bit flip that occurs in the parity bit, valid bit, data bits, or mask bits of entry 110a. In the case of single bit errors, a correct value may be determined and applied to the erroneous bit, so that the stored value of the bit is correct for subsequent accesses. Error detection and correction 120 may also detect a double bit flip that occurs in any combination of the parity bit, valid bit, data bits, or mask bits of entry 110a (e.g., parity bit and data bit, parity bit and mask bit, data bit and mask bit, and so on). In some scenarios, a double bit error may be corrected, so that the stored values of the erroneous two bits are correct for subsequent accesses.

To provide complete error detection for single and double errors in entries of TCAM 100, error detection and correction 120 may generate an error correction code (ECC) that is a single error correction double error detection (SECDED) type of ECC. The SECDED ECC may be generated from an input of bit values for the entry, in particular the parity bit value and respective bit values that indicate the presence (or absence) of don't-care conditions in the memory cells 112 of an entry 110. For example, if a memory cell, such as 112a, stores a don't-care state (e.g., data bit=0 and mask bit=0), then a bit for memory cell 112a may have a value of 1. Conversely, if memory cell 112a does not store a don't-care state (e.g., where at least one of the data or mask bit stores a bit value of 1), then the bit for memory cell 112a may have a value of 0. The respective bit values that indicate the presence (or absence) of don't-care conditions may be determined for each memory cell 112 for an entry 110 (e.g., memory cells 112a-112n in entry 110a). In some embodiments, the valid bit may also be provided as input to generate the SECDED ECC.

Error detection and correction 120 may generate SECDED ECCs for each entry, 110a-110n. When an entry is accessed, the SECDED ECC for the accessed entry may be evaluated with respect to the current value of the entry to provide complete detection of all single and double bit errors that can occur in the parity bit, valid bit, data bits, mask bits, or in the bits of the error correction code itself. For example, as illustrated in FIG. 1A, a lookup key 142 and 144 (which are the same input data), may be compared with each entry in TCAM 110a. If, based on the lookup key bit values and the current values of memory cells 112-114, an entry is identified as a possible match 152 and/or 154, then error detection and correction 120 may be performed to determine whether a valid match 160 has been identified (or if due to bit errors in the memory cell, the erroneous entry may not be considered a valid match to return a lookup value).

Please note that previous descriptions are not intended to be limiting, but are merely provided as a logical example of complete detection of single and double bit errors for entries of a TCAM. For example, a parity bit may be stored separately from an entry (e.g., in a RAM device storing lookup values for the TCAM).

This specification begins with a general description of a network switch, which may implement a TCAM as part of packet processing. Then various examples of a packet processor and TCAM are discussed, including different components/modules, or arrangements of components/modules that may be implemented and which may perform complete detection of single and double bit errors for entries in a TCAM. A number of different methods and techniques to implement complete detection of single and double bit errors for entries in a TCAM are then discussed, some of which are illustrated in accompanying flowcharts. Various examples are provided throughout the specification.

Figure 2:
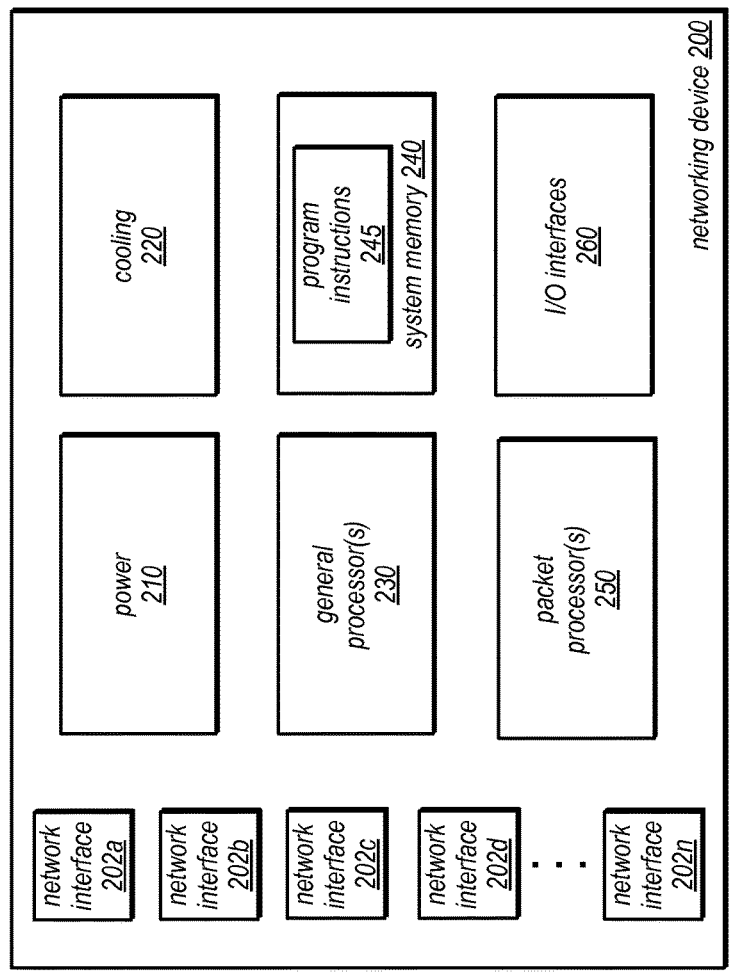
FIG. 2 is a logical block diagram illustrating a network switch that implements a packet processor, according to some embodiments.

FIG. 2 is a logical block diagram illustrating a network switch that implements a packet processor, according to some embodiments. Networking device 200 may be a networking device configured to route, forward, or otherwise facilitate the communication of different devices, systems or networks via network connections to the switch. A switch may provide electrical and logical network connections. Switches may operate utilizing data included in different OSI layers, such as layers 2 and 3 to make forwarding determinations (e.g., to send a network packet received from one source connected to the switch to another source connected to the switch). Please note that networking devices, such as a switch, in some contexts (e.g., when discussing layer 3 data) may be considered a type of router. Networking devices may also provide other services when facilitating communications, such as implementing network firewalls, network intrusion detection, and/or collecting metrics for performance analysis.

In at least some embodiments, networking device 200 may implement multiple network interfaces 202, which correspond to physical connections of different communication lines (e.g., twisted pair cables, coaxial cables, or fiber optic cables) connected to corresponding network interface ports. Network interfaces 202 may provide for different types, speeds, or other formats of network communication. For example, network interfaces 202 may provide different ports for 10 Gigabit, 40 Gigabit, or 100 Gigabit Ethernet cables. Many ports support multiple speeds, such as both 10 Gigabit and 100 Gigabit Ethernet connections.

Power 210 may be one or more power supplies that provide electricity to the various electrical components that draw upon power to perform operations (e.g., cooling 220, general processor(s) 230, system memory 240, packet processor(s) 250, and/or I/O interfaces 260. Cooling 220 may be one or more fan units implemented to circulate air and draw heat out of networking device 200.

Networking device 200 may include general processor(s) 230 which may include multiple cores, and which may be single or multi-threaded) coupled to a system memory 240 via an input/output (I/O) interface 260. Networking device 200 may be a uniprocessor system including one processor 230, or a multiprocessor system including several processors 230 (e.g., two, four, eight, or another suitable number). General processors 230 may be any suitable processors capable of executing instructions. For example, in various embodiments, processors 230 may be general-purpose or embedded processors implementing any of a variety of instruction set architectures (ISAs), such as the x86, PowerPC, SPARC, or MIPS ISAs, or any other suitable ISA. In multiprocessor systems, each of processors 230 may commonly, but not necessarily, implement the same ISA.

Networking device 200 includes one or more system memories 240 that are configured to store program instructions and data accessible by processor(s) 230. In various embodiments, system memories 240 may be implemented using any suitable memory technology, (e.g., one or more of cache, static random access memory (SRAM), DRAM, RDRAM, EDO RAM, DDR 10 RAM, synchronous dynamic RAM (SDRAM), Rambus RAM, EEPROM, non-volatile/Flash-type memory, or any other type of memory). System memory 240 may contain program instructions 245 that are executable by processor(s) 230 to implement various management functions and interfaces for networking device 200. In various embodiments, program instructions 245 may be encoded in platform native binary, any interpreted language such as Java™ byte-code, or in any other language such as C/C++, Java™, etc., or in any combination thereof.

In some embodiments, program instructions 245 may include instructions executable to implement an operating system (not shown), which may be any of various operating systems, custom or off the shelf operating systems. Any or all of program instructions 245 may be provided as a computer program product, or software, that may include a non-transitory computer-readable storage medium having stored thereon instructions, which may be used to program a computer system (or other electronic devices) to perform a process according to various embodiments. A non-transitory computer-readable storage medium may include any mechanism for storing information in a form (e.g., software, processing application) readable by a machine (e.g., a computer). Generally speaking, a non-transitory computer-accessible medium may include computer-readable storage media or memory media such as magnetic or optical media, e.g., disk or DVD/CD-ROM coupled to computer system via an I/O interface. A non-transitory computer-readable storage medium may also include any volatile or non-volatile media such as RAM (e.g. SDRAM, DDR SDRAM, RDRAM, SRAM, etc.), ROM, etc., that may be included in some embodiments of computer system as system memory or another type of memory. In other embodiments, program instructions may be communicated using optical, acoustical or other form of propagated signal (e.g., carrier waves, infrared signals, digital signals, etc.) conveyed via a communication medium such as a network and/or a wireless link, such as may be implemented via network interface.

Networking device 200 may implement one or multiple I/O interface(s) 260 to provide access to networking device 200 (e.g., to perform various switch management operations). In one embodiment, I/O interfaces 260 may be configured to coordinate I/O traffic between processor 230, system memory 245 and any peripheral devices in the system. In some embodiments, I/O interfaces 260 may perform any necessary protocol, timing or other data transformations to convert data signals from one component (e.g., system memory 245) into a format suitable for use by another component (e.g., processor 230). In some embodiments, I/O interfaces 260 may include support for devices attached through various types of peripheral buses, such as a variant of the Peripheral Component Interconnect (PCI) bus standard or the Universal Serial Bus (USB) standard, for example. In some embodiments, the functions of I/O interfaces 260 may be split into two or more separate components, such as a north bridge and a south bridge, for example. Also, in some embodiments, some or all of the functionality of I/O interfaces 260, such as an interface to system memory 240, may be incorporated directly into processors 230.

Figure 3:
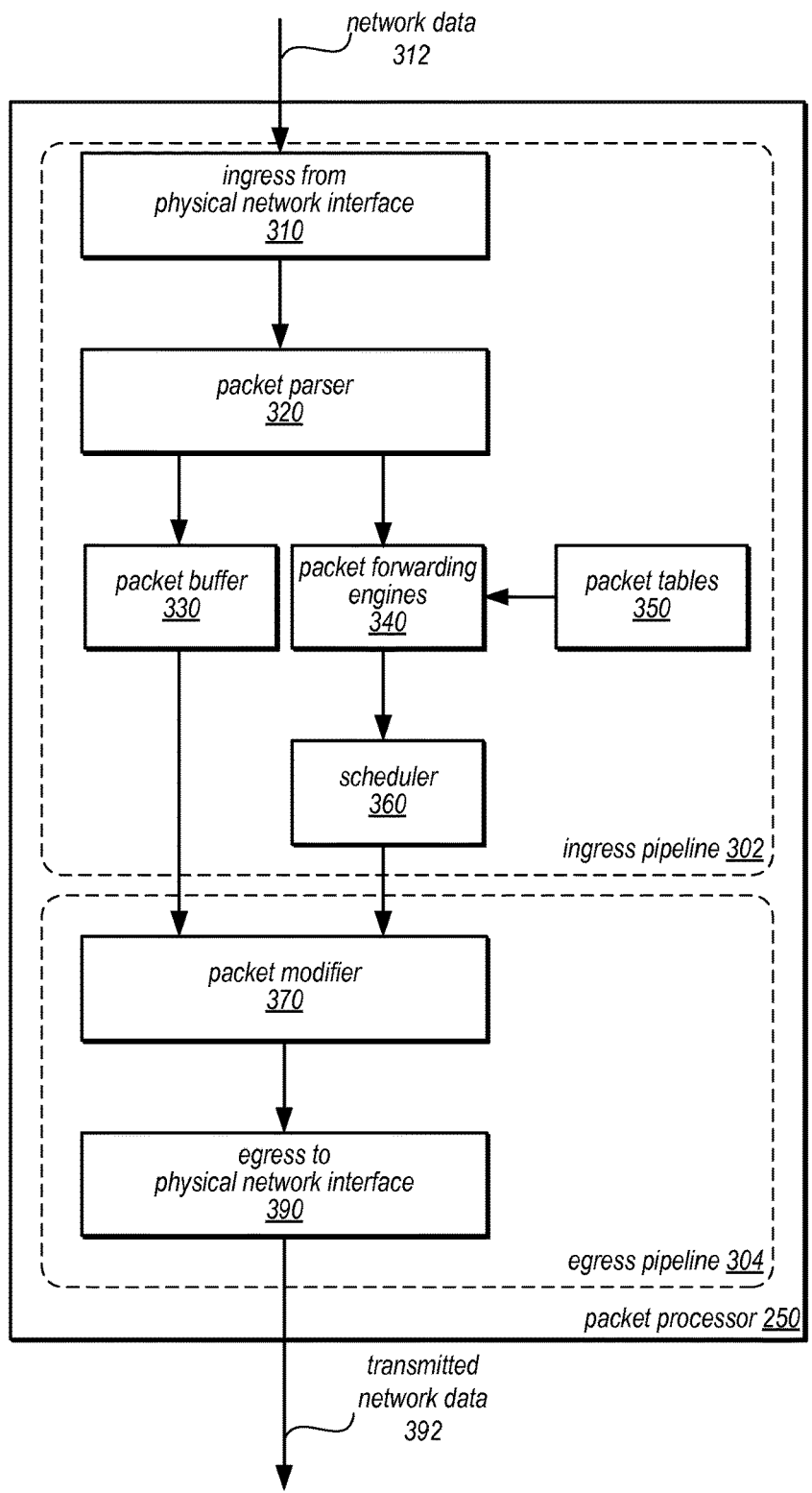
FIG. 3 is a logical block diagram illustrating a packet processor that implements a TCAM, according to some embodiments.

As noted in FIG. 2, one or more multiple packet processors 250 may be implemented to process data received via network interface(s) 202 at networking device 200. Packet processor(s) 250 may be implemented as dedicated hardware to perform various stages of packet processing for networking device 200. For example, packet processor(s) 250 may be implemented as an application specific integrated circuit (ASIC), field programmable gate array (FPGA), or other dedicated circuitry that performs packet processing. Packet processor(s) 250 may be assigned to one or multiple network interface(s) 202, performing dedicated processing of network data received via the assigned network interface(s) 202. FIG. 3 is a logical block diagram illustrating a packet processor that implements a TCAM, according to some embodiments. Note that a packet processor may sometimes be referred to as a "network switch" (e.g., when implemented as a switch-on-a-chip). However, the term "network switch" is also commonly used to describe networking hardware, such as a switching hub, that may implement one or multiple packet processors as well as other hardware (such as discussed above with regard to networking device 200 in FIG. 2). Therefore, the term "packet processor" has been used herein to prevent confusion when referring to dedicated hardware for performing packet forwarding.

Packet processor 250 may implement multiple processing pipelines to output a processed network packet. For example, as illustrated in FIG. 3, ingress pipeline 302 and egress pipeline 304 may be implemented to provide forwarding of network packets as part of the data plane so that forwarding may be performed without software-based techniques. Ingress pipeline 302 may include different components, units, or stages, such as an ingress unit from a physical network interface 310, a packet parser 320, a packet buffer 330, packet metadata lookups 340, and scheduler 350. Ingress pipeline 302 may also access packet tables 350 and other packet routing information. Egress pipeline 304 may include a packet modifier 370 with access to other packet modification data, and an egress unit to physical network interface 390.

As data is received from network interfaces, ingress unit 310 may provide a physical layer (PHY) interface and Ethernet Media Access Control (MAC) layer interface. These interfaces may evaluate a stream of network data 312 (e.g., bit stream) received at packet processor 250 to detect valid streams and segment the stream into datagrams (e.g., packets/frames). For instance, the PHY layer may receive and transmit data across physical connections (e.g., such as electrical signals received over twisted pair or coaxial cable or optical signals received over optical fiber) at network interfaces 202. The PHY layer may implement different techniques dependent on the speed or type of network interface configured (e.g., Ethernet 10BASE-T, 100BASE-TX, and 1000BASE-T forms), such as encoding, multiplexing, synchronization, clock recovery and data serialization. Various signaling standards, such as IEEE 802.3, may govern the performance of the PHY layer consistent with the open systems interconnection (OSI) model for communications. The MAC layer may delimit frames and packets from the stream of data. Error checking may also be implemented at the MAC layer, checking for different errors, such as frame check sequence (FCS), inter-frame gap enforcement, and frame preambles.

Packet parser 320 may receive a network packet from ingress 310 and separate the packet header from the packet payload. The payload of the packet may be stored in packet buffer 330. Packet parser 320 may parse the packet header to determine and/or extract data for making a forwarding decision for the packet. For example, packet parser 320 may extract different level headers (e.g., L2, L3, and L4 headers) included in an Internet Protocol (IP) version 4 packet, such as the source MAC address, the destination MAC address, the source IP address, the destination IP address, and port numbers. The extracted data may then be utilized to perform lookups to make forwarding decisions at packet forwarding engines 340.

Packet forwarding engines 340 may access data stored in packet tables 350 to make forwarding and tunneling decisions for the network packet based on information in the packet header (e.g., packet metadata) extracted by packet parser 320. For example, packet forwarding engines 340 may perform lookups for data in level 2 (L2) portions of the packet to perform L2 forwarding. L2 forwarding may access a MAC address table in packet tables 350 perform two lookups (which may be in parallel). The first lookup may be performed with a key extracted from the packet header at packet parser 320 (e.g., a VLAN and source MAC address), to determine whether an entry for the packet is present in the MAC address table. If the source MAC address is unknown, then a mapping determination may be made to map the source MAC address to a port identified in the packet header. If the MAC address is known but attached to a different port than indicated in the MAC address table, then an operation may be performed to move the source MAC address to the port identified in the packet header. Otherwise the MAC address is known in the MAC address table. Another lookup to the MAC address table may also be performed with another key (e.g., the VLAN and the destination MAC address). The network packet may be routed if the MAC address table contains an entry for the destination MAC address owned by the networking device 200 (otherwise other operations may be performed, such as trapping the network packet for the CPU, bridging the packet out of a listed interface, or flooded out of all ports in an STP forwarding state).

Similarly, packet forwarding engines 340 may also perform lookups for data in level 3 (L3) portions of the packet to perform L3 forwarding, in some embodiments. For example, internet protocol (IP) headers for the packet may be evaluated with respect to entries in tables, such as a routing table, to determine forwarding to be performed. Packet forwarding engines 340 may also determine whether tunneling is enabled for the packet. For instance, a tunnel start table may be accessed which indicates whether a tunnel header is to be inserted into the packet. As packet forwarding engines 340 make forwarding decisions about the packet (e.g., for L2, L3 and/or tunneling), the decisions are maintained as packet metadata. The packet metadata may be provided to scheduler 360 for scheduling determinations.

As discussed above, packet tables 350 may be implemented in one or multiple storage devices, such as various memory devices (e.g., content addressable memory, such as a TCAM, and/or random access memory) to store table data for performing different routing decisions. Tables may include a VLAN table, MAC address table, routing table, adjacency table, next hop table, tunnel start table, tunnel termination table, and/or actions table. Each of these different tables may be utilized to retrieve or determine packet forwarding decisions, tunneling decisions, and associated modifications that may need to be made to network packets.

Scheduler 360 may control the buffering of packets and scheduling of operations within packet processor 250. For example, scheduler 360 may implement a memory management unit to allocate available memory segments in packet buffer 330 to store packets to be buffered. If a packet needs to be buffered (e.g., because the egress interface is congested), scheduler 360 may store the packet in a private pool of memory assigned to a particular physical interface port for the packet or shared pools of memory to store packets (e.g., if the private pool of memory is full). Scheduler 360 may also implement a memory management unit to dequeue packets from packet buffer 330 for final processing and egress. Scheduler 360 may provide the appropriate metadata for a packet to modifier 360.

Network packets that have passed through ingress pipeline 302 may be scheduled or released from packet buffer 330 for modification, reassembly and egress as part of egress pipeline 304. Packet modifier 370 may be implemented to modify packet headers based on the routing decisions made at the packet metadata determine by packet forwarding engines 340. For example, if tunneling is enabled for a packet, packet modifier 370 may create and insert the appropriate tunnel header in order to encapsulate at least a portion of the packet to implement a tunneling protocol. Packet modifier 370 may also perform modifications to other data in the packet header. Once the modified packet has been reassembled, egress unit to physical network interface 290 may utilize the physical layer (PHY) interface and the Ethernet Media Access Control (MAC) layer interface to transmit network packets as network data 392 via the appropriate physical connection (e.g., coaxial, twisted pair, or optical cable).

Figure 4:
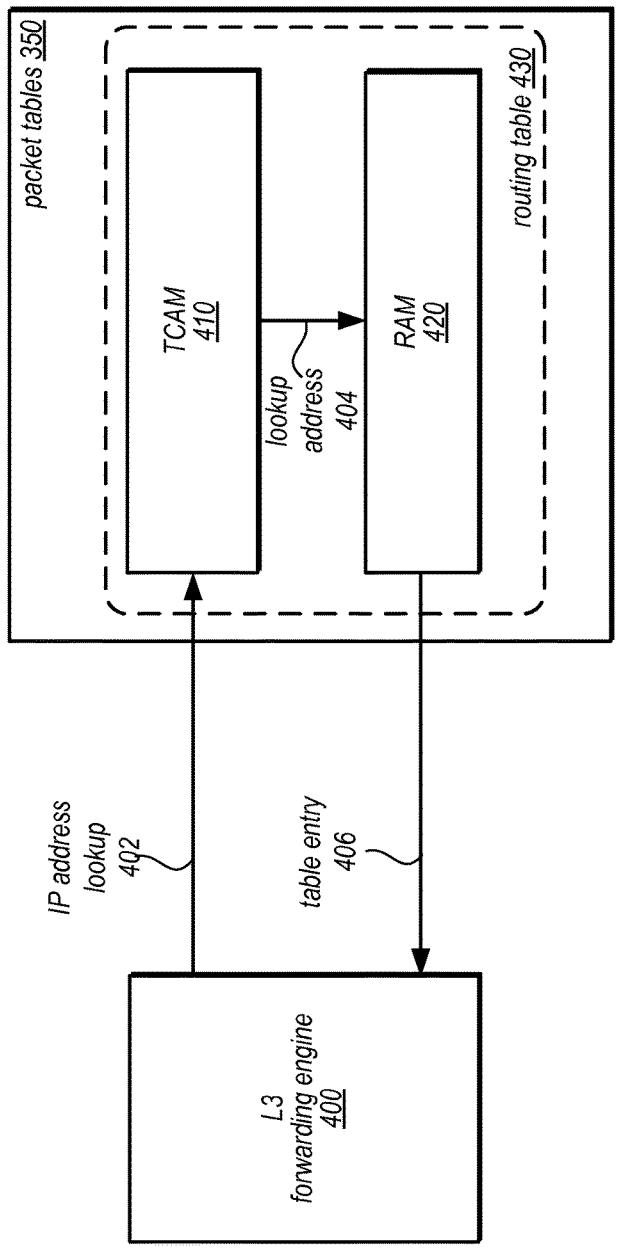
FIG. 4 is a logical block diagram illustrating a TCAM implemented for storing packet tables for a packet processor, according to some embodiments.

As noted above, packet tables 350 may store data to make forwarding decisions for network packets. Lookups may be performed to packet tables 350 to retrieve information appropriate to a network packet. In various embodiments, TCAM(s) may be implemented to provide data appropriate to a network packet. FIG. 4 is a logical block diagram illustrating a TCAM implemented for storing packet tables for a packet processor, according to some embodiments. A forwarding engine, such L3 forwarding engine 400 (which may be one of multiple packet forwarding engine(s) 340), may make forwarding decisions based on information obtained from an L3 header in a network packet, such as an IP header. Routing table 430 may be implemented as part of packet tables 350 to store routing information according to IP address. For example, a routing table may indicate a next hop IP address for the IP address of the network packet being processed.

To access the appropriate information specific to an IP address for a network packet, L3 forwarding engine 400 may perform a lookup 402 using the IP address of a network packet as a lookup key to TCAM 410. TCAM 410 may store entries with values that correspond to IP addresses utilized as lookup keys. When IP lookup 402 is received, TCAM 410 may compare the IP address with each entry in TCAM 410. If an entry matches, TCAM 410 may validate that the value in the entry is a valid match with respect to an SECDED ECC generated for the value in the entry, according to the various techniques discussed below with regard to FIGS. 5-7. In some embodiments, multiple entries may match, and therefore a selection ordering of matches may be implemented (e.g., according to the ordering of matching entries in the table, where a higher entry is selected as the matching entry above a lower matching entry). A corresponding lookup return value may be generated or identified based on a valid match entry. For instance, in FIG. 4, the lookup return value may be an address to a location in a random access memory 420 that stores the appropriate data for the IP address (e.g., the IP address of the next hop for the network packet). TCAM 410 (or another component) may direct the access at the lookup address 404 in RAM 420 in order to provide the data store in the address to L3 forwarding engine 400 as the table entry 406 in routing table 430 for the IP address.

Figure 5:
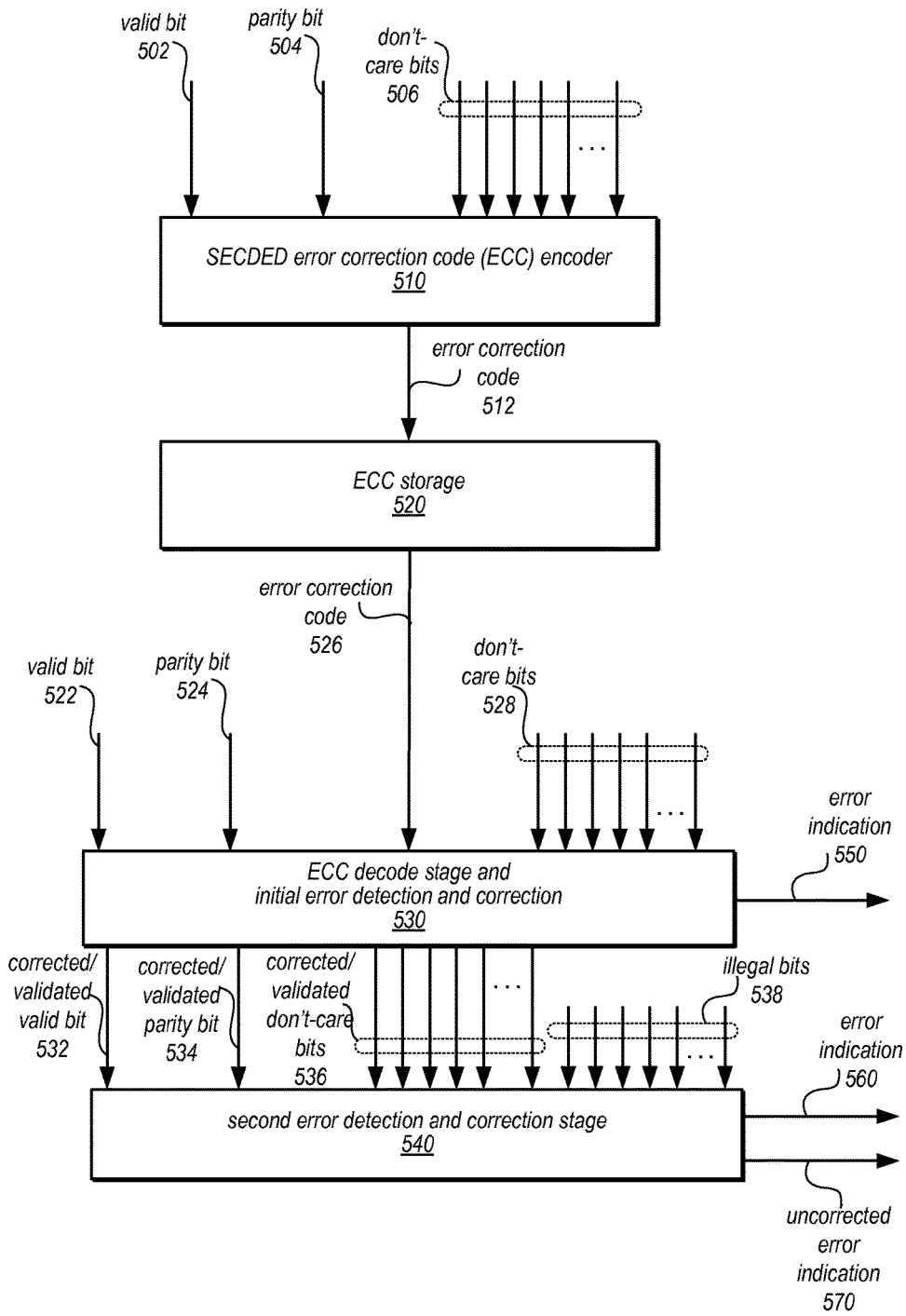
FIG. 5 is a logical block diagram of encoding and decoding single error correction double error detection (SECDED) error correction codes for an entry of a TCAM, according to some embodiments.

Complete detection of single and double bit errors for entries of a TCAM may be performed by evaluating a SECDED ECC generated for an entry. FIG. 5 is a logical block diagram of encoding and decoding single error correction double error detection (SECDED) error correction codes for an entry of a TCAM, according to some embodiments. A TCAM may implement SECDED ECC encoder 510 in order to generate an SECDED ECC for an entry of the TCAM from input data determined from the value of the entry. For example, as illustrated in FIG. 5, valid bit 502, parity bit 504, and don't-care bits 506 may be provided as input to SECDED ECC encoder 510.

Valid bit 502, as mentioned above, may be determined from the data bit values of each memory cell in an entry. For example, the valid bit may be set, storing a value of 1, to indicate that the entry is valid for performing lookups. If, however, the valid bit is not set, storing a value of 0, then the valid bit indicates that the entry should not be considered for matching with a lookup key. Parity bit 504 may be determined based on the number of times a value, 1 or 0, is stored in the data bits of memory cells for an entry. For example, a parity bit P for an entry may be defined as the "exclusive or" of the data bits for each memory cell in the entry (e.g., $P = \text{data bit}_0 \oplus \text{data bit}_1 \oplus \ldots \oplus \text{data bit}_N$). Don't-care bits 506 may be bits indicative of don't-care conditions or states in the memory cells of the entry, which may be defined as the "not value" of the "or" of the data bit and mask bit for a memory cell (e.g., $\text{Don't-care}_i = \text{NOT}(\text{mask bit}_i \text{ OR data bit}_i)$). Encoding don't-care bits 506 as opposed to data bits and/or mask bits for an entry may greatly reduce the size of the SECDED ECC (e.g., reducing the SECDED ECC up to 50%).

SECDED ECC encoder 510 may take the input bit values and apply techniques to generate a respective SECDED ECC for the value of the entry. For example, SECDED ECC encoder 510 may apply techniques to generate an extended Hamming code as the SECDED ECC for a value where multiple check bits that make up the SECDED error correction code. For example, a code generator matrix may be determined. The input data to be encoded (bits for 502, 504, and 506) may be multiplied by the code generation matrix. The check bits may be separated from the data bits in the result and stored as the SECDED ECC. Note that hardware implementations of these matrix multiplications may include one or more multiple trees of "exclusive or" that generate the check bits in parallel. In at least some embodiments, SECDED ECC generator 510 may process different ones of the input bits (502, 504, and 506) to generate portions of the SECDED ECC (e.g., different check bits). The different portions may then be combined as the SECDED ECC for the entry. Once generated, the ECC may be stored 512 in ECC storage 520. ECC storage 520 may be stored in a different location or memory for an entry (e.g., on another memory device such as RAM 420 in FIG. 4). In at least some embodiments, parity bit 504 may be stored in ECC storage 520. The SECDED ECC values may be generated for each entry in a TCAM.

The TCAM may subsequently retrieve the error correction code 526 at a later time in order to decode the ECC for error detection and correction. For instance, an access of the entry may result in the retrieval of the ECC 526 from ECC storage 520. The valid bit 522, parity bit 524, and don't-care bits 528 may also be retrieved (in the case of valid bit 522 and parity bit 524) from the current bit values in the entry, and/or determined (in the case of don't-care bits 528) based on the data bit values currently in the entry. The TCAM may implement a two-stage decoder, in some embodiments. For example, as illustrated in FIG. 5, ECC decode stage and initial error detection and correction 530 may be implemented to decode the ECC 526 and validate the parity bit, valid bit, and don't-care bits. ECC 526 may be decoded according to a similar technique discussed above for encoding (e.g., an extended Hamming code). For instance, the check bits combined with the bits for inputs 522, 524, and 528 as a single data word may be multiplied with respect to an error check matrix. The resulting word generated may be syndrome word. The syndrome word may indicate if no errors are detected, a single bit error is detected, or a double bit error is detected, in some embodiments. If a single bit error is detected for these bits (valid bit, parity bit, or don't-care condition bits), as discussed below with regard to FIG. 7, then the single bit error may be corrected. A corrected value may be set in the erroneous bit. An error indication 550 may also be provided. A double bit error including the valid bit 522, parity bit 524, or don't-care bits may also be detected.

Stage 530 may provide corrected or validated valid bit 532, parity bity 534, and don't-care bits 536 to second error detection and correction stage 540 as inputs. Illegal bits 538 may also be determined for the current value of the entry. Illegal bits 538 may indicate the presence (or absence) of an illegal state in a memory cell. Illegal bits 538 may be defined as the "and" value of the data bit and mask bit (e.g., Invalid bit$_i$=mask bit$_i$ AND data bit$_i$) for the current data bit and mask bit values of each memory cell in the entry being validated. Utilizing the provided inputs, second error detection and correction stage 540 may correct some double bit errors that include a bit flip at a data bit or a mask bit value for the entry. Uncorrected error indications 560 may also be provided by second error detection and correction stage 540, in some embodiments. Upon completion of stage 540 all single bit errors or double bit errors in the entry of the TCAM may be detected and all single bit errors may be corrected. Some double bit errors may be corrected.

Figure 6:
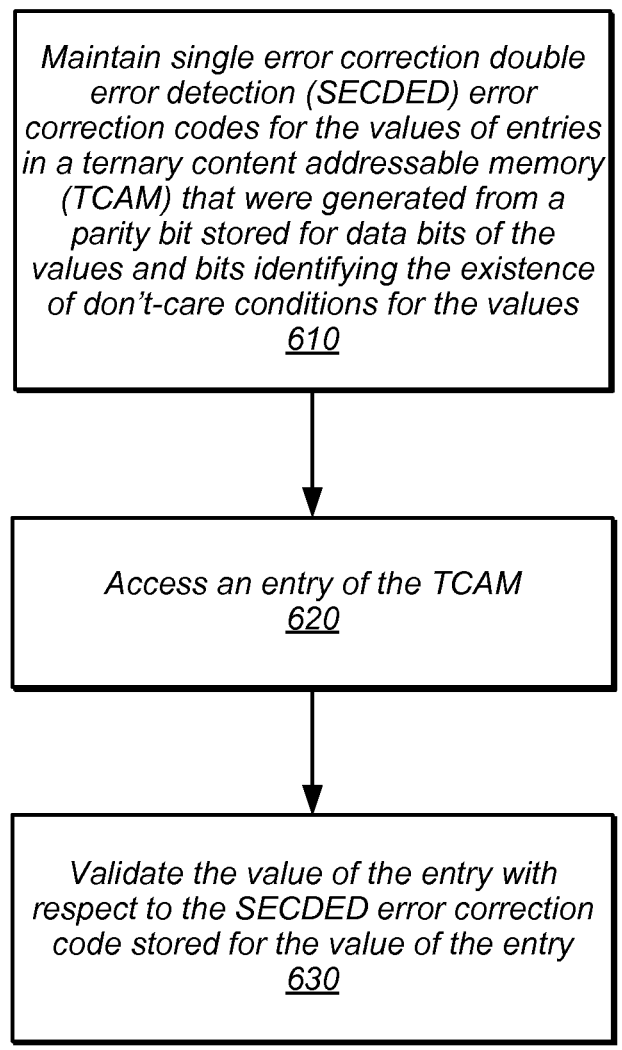
FIG. 6 is a high-level flowchart illustrating various methods and techniques to implement complete single and double error detection for entries of a TCAM, according to some embodiments.

FIGS. 2-5 provide an example of a network switch that implements a packet processor which may implement a TCAM that provides complete detection of single and double bit errors for entries in the TCAM. However, numerous other types or configurations of TCAMs or hardware implementing TCAMs, such as other packet processors or circuitry for switches, routers, network bricks, or other networking devices, may provide complete detection of single and double bit errors for entries in the TCAM. FIG. 6 is a high-level flowchart illustrating various methods and techniques to implement complete single and double error detection for entries of a TCAM, according to some embodiments. The various components described above may implement these techniques (in addition to those described with regard to FIGS. 7 and 8 below) as well as various other packet processing pipelines and packet processors.

As indicated at 610, SECDED error correction codes may be maintained for the values of entries in a TCAM. The SECDED error correction codes may be generated from a parity bit for data bits of memory cells in a TCAM and the bits identifying existence of don't-care conditions in the memory cells for the values of entries, as discussed above with regard to FIGS. 1 and 5. The SECDED error correction codes may be maintained in a separate memory device, in some embodiments.

As indicated at 620, an entry of the TCAM may be accessed. Such an access may be performed as part of a lookup operation, in some embodiments. For example, a lookup key may be received at the TCAM. The bit values of the lookup key may be compared with the respective bit values of the values in the entries of the TCAM. Matching entries may be identified where the bit values of the lookup key match the bit values of the entry value (except where the entry indicates a don't-care condition in which case either a 1 or a 0 in the lookup key is considered a match). An identified entry that matches the lookup key may be the accessed entry. In some embodiments, the entry of the TCAM may be accessed as part of a scrubbing operation. For example, TCAM entries may be periodically accessed to trigger performance of error detection and correction techniques. In this way, correctable errors in the values of the entries may be corrected to reduce the occurrence of false hits (when an invalid value of an entry erroneously matches a lookup key) and false hits (when an invalid value of an entry doesn't match a lookup key that it would have matched but for bit error). Bit errors in the valid bit may also be corrected to prevent entries from being ignored when actually valid, and to prevent entries that should not be considered from evaluation.

As indicated at 630, in response to the access of the entry, the value of the entry may be validated with respect to the SECDED error correction code maintained for the value of the entry. Validation of the entry may include detecting single and double bit errors in the parity bit, valid bit, data bits or masks bits for the value of the entry. Single bit errors may be corrected, and in some scenarios, double bit errors may be corrected. Correct values may be determined and applied to the parity bit, valid bit, data bits or masks bits for the value of the entry as discussed according to the techniques below in FIG. 7.

Figure 7:
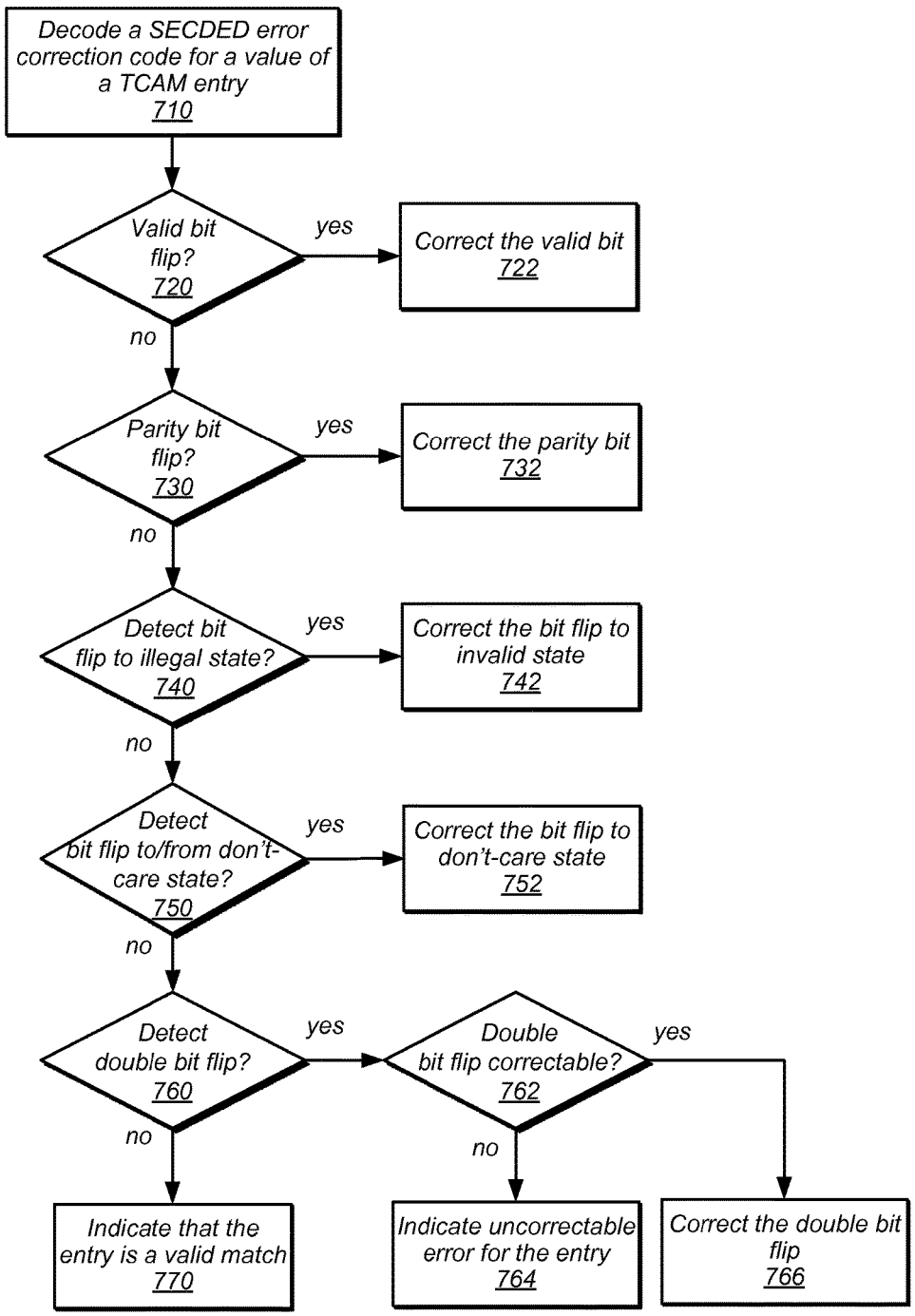
FIG. 7 is a high-level flowchart illustrating various methods and techniques for detecting and correcting errors for entries of a TCAM that implement complete single and double error detection, according to some embodiments.

Encoding the valid bit, parity bit, and bits indicating the existence of don't-care conditions for a value of a TCAM entry may provide the information necessary to detect all single bit errors and double bit errors in the value of the entry. FIG. 7 is a high-level flowchart illustrating various methods and techniques for detecting and correcting errors for entries of a TCAM that implement complete single and double error detection, according to some embodiments.

As indicated at 710, the SECDED error correction code for a value of a TCAM entry may be decoded. For example, the SECDED error correction code may be the check bits generated for an extended hamming code. Decoding the check bits with respect to the current value of the TCAM entry may be performed using the same input data to generate the SECDED error correction code, the valid bit, the parity bit, and the bits indicating the existence of don't-care conditions for the value of the TCAM entry. The result of the decode operations may provide a syndrome code. The syndrome code may then be utilized to detect and/or correct the various bit errors discussed below.

For example, as indicated at 720, a valid bit flip may be detected (e.g., from 0 to 1 or from 1 to 0). The syndrome code may indicate that the valid bit is incorrect. As indicated at 722, the valid bit may be corrected (e.g., by generating an error correction mask to flip the valid bit from the incorrect value to the correct value). A similar technique may be performed for the parity bit. As indicated at 730, a parity bit flip may be detected (e.g., from 0 to 1 or from 1 to 0). The syndrome code may identify the parity bit as the erroneous bit. As indicated at 732, the parity bit may be corrected (e.g., by the application of an error correction mask).

As indicated at 740, a bit flip to an illegal state may be detected, in some embodiments. An illegal state, as discussed above with regard to FIG. 1B, may occur when the data bit and the mask bit values of a memory cell are both set to 1 (e.g., a change from data bit=0, mask bit=1 to data bit=1, mask bit=1, from data bit=1, mask bit=0 to data bit=1, mask bit=1, or from data bit=0, mask bit=0 to data bit=1, mask bit=1). Thus, an "and" operation may be applied to the data and mask bit values for each memory cell, which will return a 1 value for each memory cell with an invalid state. As indicated at 742, the bit flip to the illegal state may be corrected, in some embodiments. In the scenario where a single bit flip resulted in the invalid state, the bit value to correct may be determined based on whether a parity error occurs for the value of the entry. For example, if a parity error occurs (when the data bits in the current value do not result in the same parity value as is currently stored), then the bit that flipped to 1 was the data bit in the identified memory cell (as the parity bit is determined by the number of data bits). If no parity error occurs, then the mask bit in the memory cell flipped to 1. In the scenario where a double bit flip resulted in the illegal state (e.g., from data bit=0, mask bit=0 to data bit=1, mask bit=1), the syndrome code may be used to recognize the correction. For example, the syndrome code may identify a memory cell that was supposed to have an existing don't-care condition (data bit=0, mask bit=0), but does not (as discussed below at 750). If that same memory cell is currently identified as in an illegal state (data bit=1, mask bit=1), then it may be determined that the double bit flip occurred in both the data bit and mask bit of the same memory cell, and the appropriate correction to revert the values back to 0 performed.

As indicated at 750, a bit flip to or from a don't-care state may be detected, in various embodiments. Possible single bit flips to and from the don't-care state, where data and mask bit values are 0, may include a change from data bit=0, mask bit=1 to data bit=0, mask bit=0, from data bit=1, mask bit=0 to data bit=0, mask bit=0, from data bit=0, mask bit=0 to data bit=1, mask bit=0, or from data bit=0, mask bit=0 to data bit=0, mask bit=1. For example, the syndrome code may indicate the presence or absence of a don't-care condition for a memory cell that differs from the bits encoded in the SECDED error correction code, and therefore identifies the memory cell in which the bit flip to/from the don't-care condition occurred. To determine which bit changed in value (the data bit or the mask bit), a check for a parity error may be performed. Parity error, as noted above, is determined by checking to see if the data bits of the memory cells generate the same parity bit as currently stored (which is different than a bit flip at the parity bit which may be detected and corrected according to the techniques discussed above with regard to 730). If parity error exists, then the data bit value changed for the memory cell. If parity error does not exist, then the mask bit value changed for the memory cell. If a don't-care condition was expected for the memory cell, then the bit value was changed to a 1 (at either the data bit or mask bit). If the don't-care condition was not expected, then the bit value was changed to a 0 (at either the data bit or the mask bit). Thus, a correction may be applied to either the data bit or the mask bit in order to correct the bit flip to/from the don't-care condition, as indicated at 752.

In addition to single bit error detection, double bit error detection may be performed for all possible double bit errors of the data bits, mask bits, and parity bit of an entry. Double error detection may be performed utilizing the syndrome code, which may indicate that two bit errors have occurred (e.g., by having a non-zero value with even overall parity). In some scenarios, the double bit flip may be correctable, as indicated by the positive exit from 762. Information, such as whether illegal states are detected for a particular memory cell may be utilized in addition to the syndrome code to correct double bit flips. For example, the scenario discussed above with regard to element 740 (when two bits flip in the same memory cell to create an illegal state from a don't-care condition) may be corrected. Additional double bit flip scenarios that may be corrected include a bit flip in the parity bit (as discussed above at 730) and a bit flip at one other data or mask bit value to set the memory cell to an illegal state (where both bit values are 1). In such cases, the double bit flip may be corrected, as indicated at 766. For instance, because a bit flip to the illegal state from the don't care condition is recognizable, a detected double bit error with an illegal state not flipped from a don't care state only has one value that changed (either the mask bit or the data bit changed to a value of 1). As the parity bit can be validated and corrected, then the corrected value of the parity bit can be used to determine whether the mask bit or the data bit flipped in the memory cell to cause the illegal state.

If the double bit flip is not correctable, as indicated by the negative exit from 762, then an uncorrectable error for the entry may be indicated, as indicated at 764. If no double bit flip is detected, then it may be indicated that the entry is a valid match, as indicated at 770.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

Various ones of the methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Boundaries between various components and operations are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of embodiments as defined in the claims that follow.

What is claimed is:

1. A system, comprising:
    a packet processor that implements a ternary content addressable memory (TCAM), wherein the TCAM stores a plurality of entries, wherein an entry is stored in a plurality of memory cells that each comprise a respective data bit and a respective mask bit;
    wherein the TCAM is configured to:
        for respective values of the entries stored in the TCAM:
            encode as a single error correction double error detection (SECDED) error correction code:
                a parity bit, stored for the data bits of the memory cells of the value, and
                respective bits that identify the existence of a don't-care condition in the memory cells of the value;
            maintain the SECDED error correction code for the entry;
        receive a lookup key;
        identify one of the entries as a match for the lookup key;
        validate the value of the identified entry with respect to the SECDED error correction code; and
        in response to a determination that the value is valid; return a lookup value for the identified entry.

2. The system of claim 1, wherein TCAM is further configured to:
  receive another lookup key;
    identify another one of the entries as a match for the other lookup key;
    validate the value of the other entry with respect to the SECDED error correction code far the other entry;
    based on the validation of the other entry, detect a bit flip in the parity bit stored for the data bits of the value of the other entry; and
    correct the parity bit.

3. The system of claim 1, wherein to decode the SECDED error correction code with respect to the value of the identified entry to validate the value, the TCAM is configured to:
  validate the parity bit and the bits that identify the existence of the don't-care condition in the memory cells of the entry;
  determine bits that identify the existence of an illegal condition in the memory cells of the entry; and
  based on the validation of the parity bit and the bits that identify the existence of the don't-care condition and based on the bits that identify the existence of the illegal condition the memory cells of the entry, validate the data bits and the mask bits for the identified entry.

4. The system of claim 1, wherein the system is a network switch.

5. A method, comprising:
  maintaining single error correction double error detection (SECDED) error correction codes for respective values of a plurality of entries stored in a ternary content addressable memory (TCAM) at the TCAM wherein individual ones of the plurality of entries of the TCAM comprise a plurality of memory cells, wherein a memory cell comprises a data bit and a mask bit, wherein the SECDED error correction codes are generated for the respective values according to:
    parity bits, stored for the data bits of the memory cells of the plurality of entries, and
    respective bits that identify the existence of a don't-care condition is the memory cells of the plurality of entries;
  receiving input data or a lookup key at the TCAM;
  identifying, by the TCAM, one of the plurality of entries as a match for the input data or the lookup key; and
  validating, by the TCAM, the value of the identified entry with respect to the SECDED error correction code.

6. The method of claim 5, wherein the SECDED error correction code is further generated from a valid bit for the one entry, wherein the valid bit indicates that the one entry is valid for perforating lookups, and wherein validating the respective value of the one entry comprises validating the valid bit.

7. The method of claim 6, wherein validating the respective value of the one entry further comprises:
  detecting a bit flip in a corresponding one of the parity bits that is stored for the data bits of the memory cells of the one entry; and
  correcting the bit flip in the corresponding one parity bit.

8. The method of claim 5, wherein validating the respective value of the one entry comprises:
  detecting a double bit flip error in the value; and
  correcting the double bit flip error in the value.

9. The method of claim 5, further comprising encoding, by the TCAM, the SECDED error correction codes for the respective values of a plurality of entries stored in the TCAM.

10. The method of claim 9, wherein encoding the SECDED error correction codes, comprises:
  separately generating portions of the SECDED error correction codes; and
  combining the separately generated portions into the SECDED error correction codes.

11. The method of claim 5, wherein the TCAM is implemented as part of a networking device.

12. A ternary content addressable memory (TCAM) that stores a plurality of entries, wherein an entry is stored in a plurality of memory cells that each comprise a respective data bit and a respective mask hit, and wherein the TCAM is configured to:
  for respective values of individual ones of the plurality of entries:
    maintain a single error correction double error detection (SECDED) error correction code encoded from:
      a parity bit, stored for the data bits of the memory cells of the value, and
      respective bits that identify the existence of a don't-care condition in the memory cells of the value; and
  receive input data or a lookup key;
  identify one of the plurality of entries as a match for the input data or the lookup key;
  validate the value of the identified entry with respect to the SECDED error correction code.

13. The TCAM of claim 12 wherein to validate the value, the TCAM is configured to:
  detect a bit flip in the parity bit; and
  correct the bit flip in the parity.

14. The TCAM of claim 12, wherein the TCAM is further configured to:
  for the respective values of individual ones of the plurality of entries:
    encode the parity bit stored for the data bits of the memory cells of the value and the respective bits that identify the existence of the don't-care condition as the SECDED error correction code for the value.

15. The TCAM of claim 14,
  wherein a valid bit for the entry is included in the SECDED error correction code; and
  wherein to validate the value, the TCAM is configured to validate the valid bit far the entry.

16. The TCAM of claim 12, wherein to validate the value, the TCAM is configured to:
  detect a double bit flip error in the value; and
  correct the double bit flip error in the value.

17. The TCAM of claim 12, wherein the access to the entry is performed as part of a scrub operation for the TCAM that accesses the plurality of entries.

18. The TCAM of claim 12, wherein the TCAM is implemented as part of an application specific integrated circuit (ASIC) included in a networking device.

* * * * *